United States Patent
Song et al.

(10) Patent No.: US 9,029,865 B2
(45) Date of Patent: May 12, 2015

(54) ORGANIC LIGHT EMITTING DIODE DISPLAY AND METHOD FOR MANUFACTURING THE SAME

(71) Applicant: Samsung Display Co., Ltd., Yongin, Gyeonggi-Do (KR)

(72) Inventors: Ok-Keun Song, Yongin (KR); Woong-Sik Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/140,729

(22) Filed: Dec. 26, 2013

(65) Prior Publication Data

US 2015/0021566 A1    Jan. 22, 2015

(30) Foreign Application Priority Data

Jul. 17, 2013 (KR) .......................... 10-2013-0084294

(51) Int. Cl.
*H01L 27/14* (2006.01)
*H01L 27/32* (2006.01)

(52) U.S. Cl.
CPC .................................. *H01L 27/3248* (2013.01)

(58) Field of Classification Search
CPC . H01L 27/32; H01L 27/3202; H01L 27/3204; H01L 27/3225
See application file for complete search history.

(56) References Cited

U.S. PATENT DOCUMENTS

2010/0102335 A1* 4/2010 Takagi et al. ................... 257/88

FOREIGN PATENT DOCUMENTS

| KR | 1020040044625 A | 5/2004 |
|---|---|---|
| KR | 1020070070592 A | 7/2007 |
| KR | 1020090021443 A | 3/2009 |

* cited by examiner

*Primary Examiner* — Kyoung Lee
(74) *Attorney, Agent, or Firm* — Cantor Colburn LLP

(57) ABSTRACT

An organic light emitting diode display includes a substrate, a first electrode and an assistance electrode disposed on the substrate and separated from each other, an organic emission layer disposed on the first electrode, a contact hole which exposes the assistance electrode and is defined in the organic emission layer, and a second electrode disposed on the organic emission layer and electrically connected to the assistance electrode through the contact hole.

14 Claims, 15 Drawing Sheets

ORGANIC LIGHT EMITTING DIODE DISPLAY AND METHOD FOR MANUFACTURING THE SAME

This application claims priority to Korean Patent Application No. 10-2013-0084294 filed on Jul. 17, 2013, and all the benefits accruing therefrom under 35 U.S.C. §119, the entire contents of which are incorporated herein by reference.

BACKGROUND

1. Field

Exemplary embodiments relate to an organic light emitting diode ("OLED") display. More particularly, the exemplary embodiments relate to an OLED display displaying an image by emitting light through a front (top) surface.

2. Description of the Related Art

Recently, OLED displays have received much attention as display devices for displaying images.

The OLED display has a self-luminance characteristic and does not require a separate light source, unlike a liquid crystal display ("LCD"), and thus a thickness and a weight thereof may be decreased. In addition, the OLED display exhibits high-quality characteristics such as low power consumption, high brightness, high response speed, and the like.

Generally, the OLED display includes an organic light emitting element having a first electrode, an organic light emitting layer disposed on the first electrode, and a second electrode disposed on the organic light emitting layer.

The OLED display is generally classified into a front (top) emission type, a rear (bottom) emission type, and a dual (both-sided) emission type The front emission type OLED display has a structure in which the second electrode of an organic light emitting element is formed over an entire area of a substrate where the organic light emitting element is formed in a thin film shape in order to minimize deterioration of luminance of light generated from an organic emission layer.

However, since the second electrode formed in a thin film is formed over the entire area of the substrate in the front emission type of OLED display, a voltage drop occurs in driving power passing through the second electrode for driving the organic emission layer due to electrical resistance of the second electrode.

SUMMARY

To solve a voltage drop due to electrical resistance of a second electrode, an assistance electrode is disposed on the second electrode. The assistance electrode may be provided using a fine metal mask ("FMM"). However, the mask may be periodically replaced because a hole of the mask may become blocked.

Also, it is difficult to provide the assistance electrode of a uniform size due to blocking of the hole of the mask.

Accordingly, an exemplary embodiment provides an organic light emitting diode ("OLED") display that minimizes a voltage drop of power passing through an electrode having a large area while including a thin film for driving an organic emission layer, and a manufacturing method thereof.

An OLED display according to an exemplary embodiment includes a substrate, a first electrode and an assistance electrode disposed on the substrate and separated from each other, an organic emission layer disposed on the first electrode, a contact hole which exposes the assistance electrode and is defined in the organic emission layer, and a second electrode disposed on the organic emission layer and electrically connected to the assistance electrode through the contact hole.

In an exemplary embodiment, a connection electrode which is disposed in the contact hole and connects the assistance electrode and the second electrode may be further included.

In an exemplary embodiment, the connection electrode may contact an etching surface of an opening defined in the second electrode and an upper surface of the assistance electrode.

In an exemplary embodiment, the opening, the contact hole and the connection electrode may have a plane shape of a same size.

In an exemplary embodiment, the assistance electrode and the second electrode may be applied with a same voltage.

In an exemplary embodiment, a gate line disposed on the substrate, a data line and a driving voltage line insulated from and intersecting the gate line and separated from each other, a switching thin film transistor connected to the gate line and the data line, and a driving thin film transistor connected to the switching thin film transistor and the driving voltage line may be further included, where the first electrode may be connected to a drain electrode of the driving thin film transistor.

In an exemplary embodiment, the contact hole may overlap at least one of the data line and the driving voltage line, and a plurality of contact holes may be defined at predetermined intervals according to the data line and the driving voltage line.

In an exemplary embodiment, the contact hole may overlap at least one of the data line and the driving voltage line, and may be lengthily defined according to the data line and the driving voltage line.

In an exemplary embodiment, the organic emission layer may be disposed on the entire substrate.

In an exemplary embodiment, the first electrode may include a reflective layer, and the second electrode may include a transparent layer or a semi-transparent layer.

A manufacturing method of an OLED display according to an exemplary embodiment includes forming a thin film transistor on a substrate, forming a first electrode connected to the thin film transistor and an assistance electrode separated from the first electrode, forming an organic emission layer on the first electrode and the assistance electrode, forming a first metal layer on the organic emission layer, forming a photoresist pattern on the first metal layer, etching the first metal layer and the organic emission layer by using the photoresist pattern as a mask to define an opening exposing the assistance electrode and a contact hole in a second electrode, forming a second metal layer on the photoresist pattern, and removing the photoresist pattern to form a connection electrode disposed in the contact hole and contacting an upper surface of the assistance electrode and an etching surface of the opening.

In an exemplary embodiment, in the defining the contact hole in the second electrode, an under-cut may be provided under the photoresist pattern.

In an exemplary embodiment, the organic emission layer may be formed on the entire substrate.

In an exemplary embodiment, the first metal layer may include a transparent layer or a semi-transparent layer.

In an exemplary embodiment, the first electrode may include a reflective layer.

As shown in the invention, by forming the assistance electrode, an OLED display that minimizes a voltage drop of power passing through an electrode having a large area while being formed as a thin film for driving the organic emission layer may be provided.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
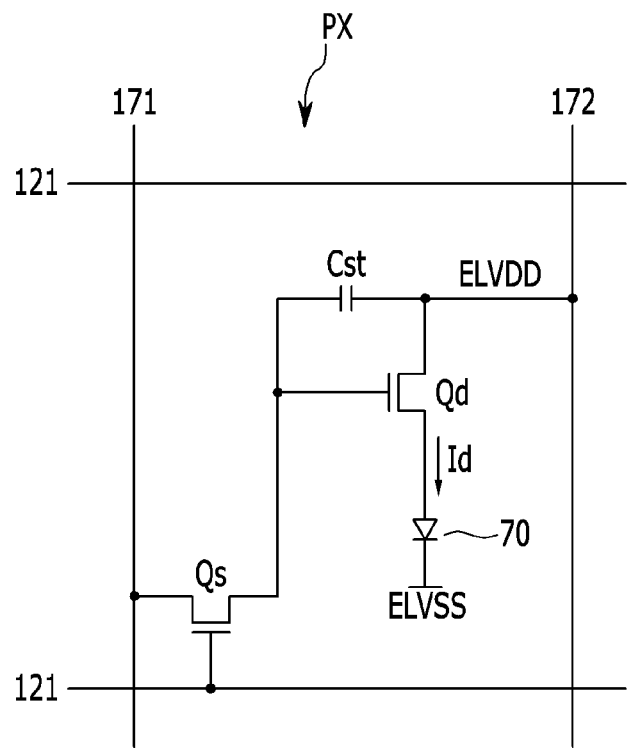
FIG. 1 is a circuit diagram of an exemplary embodiment of a pixel circuit of an organic light emitting diode ("OLED") display according to the invention.

The invention will be described more fully hereinafter with reference to the accompanying drawings, in which exemplary embodiments of the invention are shown. The described exemplary embodiments may be modified in various different ways, all without departing from the spirit or scope.

For clarity of description of the invention, parts unrelated to the description are omitted, and the same reference numbers will be used throughout this specification to refer to the same or like parts.

In the drawings, dimensions and thicknesses of components are exaggerated, omitted, or schematically illustrated for clarity and convenience of description. In addition, dimensions of constituent elements do not entirely reflect actual dimensions thereof.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

In addition, unless explicitly described to the contrary, the word "comprise" and variations such as "comprises" or "comprising" will be understood to imply the inclusion of stated elements but not the exclusion of any other elements. Further, in the specification, the word "on" means positioning on or below the object portion, but does not essentially mean positioning on the upper side of the object portion based on a gravity direction.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An organic light emitting diode ("OLED") display according to an exemplary embodiment will now be described in detail with reference to accompanying drawings.

FIG. 1 is a circuit diagram of a pixel circuit of an OLED display according to an exemplary embodiment.

As shown in FIG. 1, an OLED display according to the exemplary embodiment includes a plurality of signal lines 121, 171, and 172 and a plurality of pixels PX connected thereto and arranged in an approximate matrix form.

The signal lines include a plurality of gate lines 121 transferring a gate signal (or a scan signal), a plurality of data lines 171 transferring a data signal, and a plurality of driving voltage lines 172 transferring a driving voltage ELVDD. The gate lines 121 extend in an approximate row direction and are substantially parallel to each other, and vertical direction portions of the data lines 171 and the driving voltage lines 172 extend substantially in a column direction and are substantially parallel to each other.

Each pixel PX includes a switching thin film transistor Qs, a driving thin film transistor Qd, a storage capacitor Cst, and an OLED 70.

The switching thin film transistor Qs has a control terminal, an input terminal, and an output terminal, the control terminal is connected to the gate line 121, the input terminal is connected to the data line 171, and the output terminal is connected to the driving thin film transistor Qd. The switching thin film transistor Qs responds to the scan signal applied to the gate line 121 to transfer the data signal applied to the data line 171 to the driving thin film transistor Qd.

Further, the driving thin film transistor Qd has a control terminal, an input terminal, and an output terminal, and the control terminal is connected to the switching thin film transistor Qs, the input terminal is connected to the driving voltage line 172, and the output terminal is connected to the OLED 70. The driving thin film transistor Qd allows an output current Id having a varying magnitude according to a voltage applied between the control terminal and the output terminal of the driving thin film transistor Qd to flow.

The capacitor Cst is connected between the control terminal and the input terminal of the driving thin film transistor Qd. This capacitor Cst charges the data signal applied to the control terminal of the driving thin film transistor Qd and maintains the data signal after the switching thin film transistor Qs is turned off.

The OLED 70 has an anode connected to the output terminal of the driving thin film transistor Qd, and a cathode connected to a common voltage ELVSS. The OLED 70 displays an image by emitting light while changing the intensity thereof according to the output current Id of the driving thin film transistor Qd.

Further, the connection relationship of the thin film transistors Qs and Qd, the capacitor Cst, and the OLED 70 may be changed.

Next, an OLED display according to an exemplary embodiment will be described in detail with reference to FIGS. 2 and 3.

Figure 2:
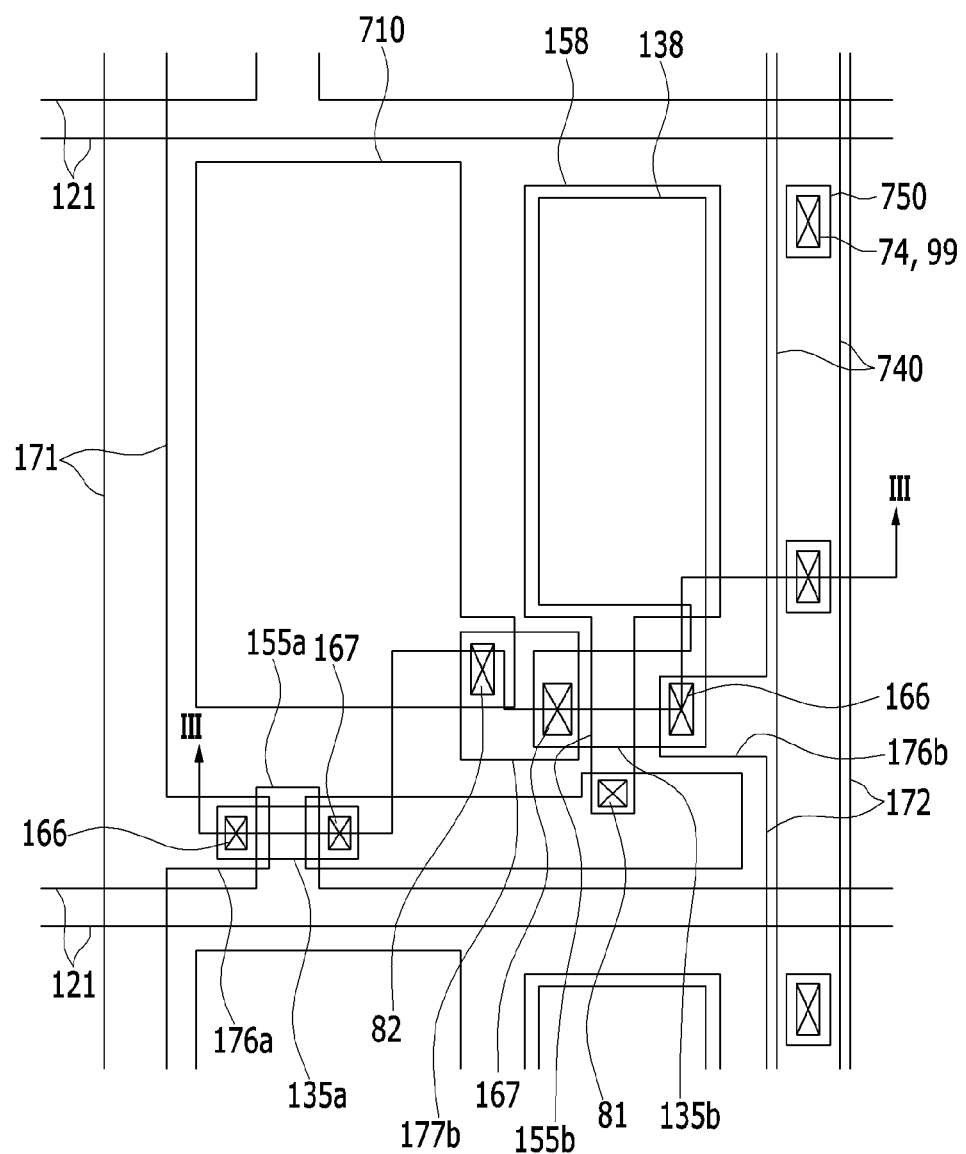
FIG. 2 is a plan view of one pixel of the OLED display of FIG. 1.
Figure 3:
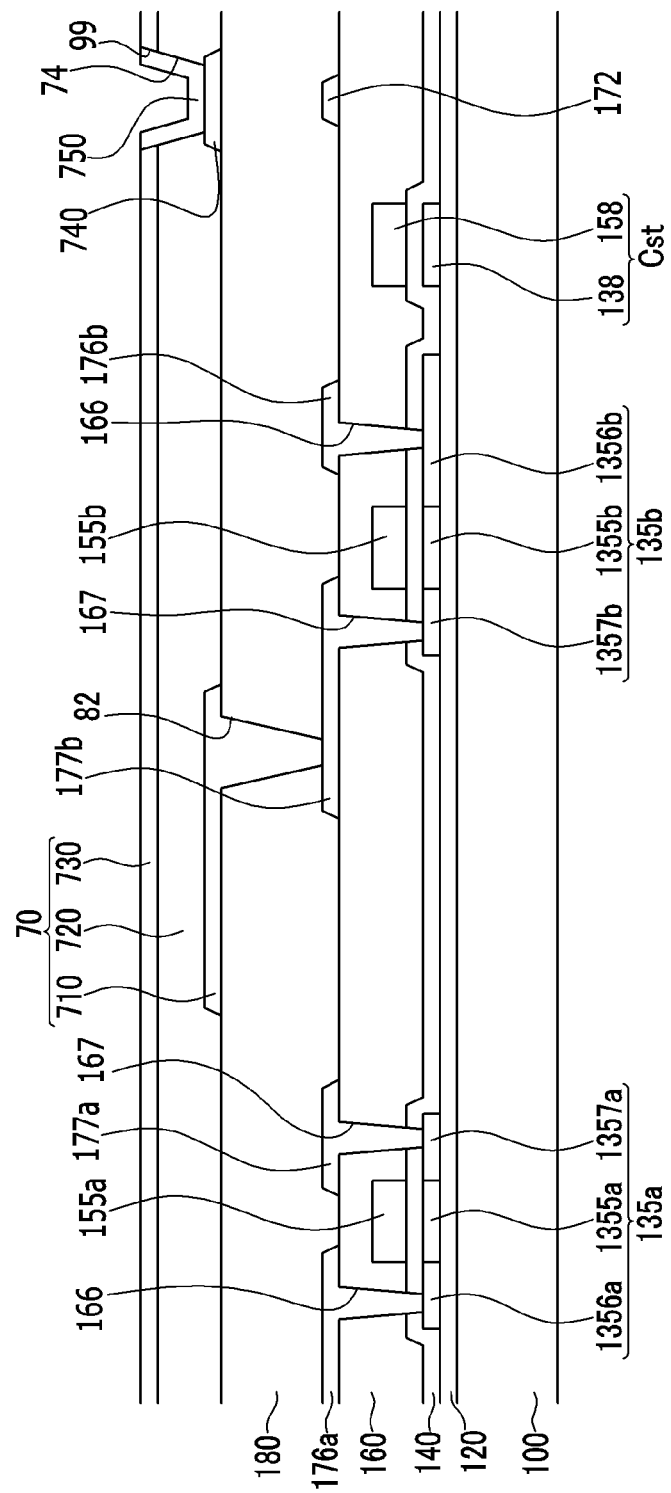
FIG. 3 is a cross-sectional view taken along line III-III of FIG. 2.
Figure 4:
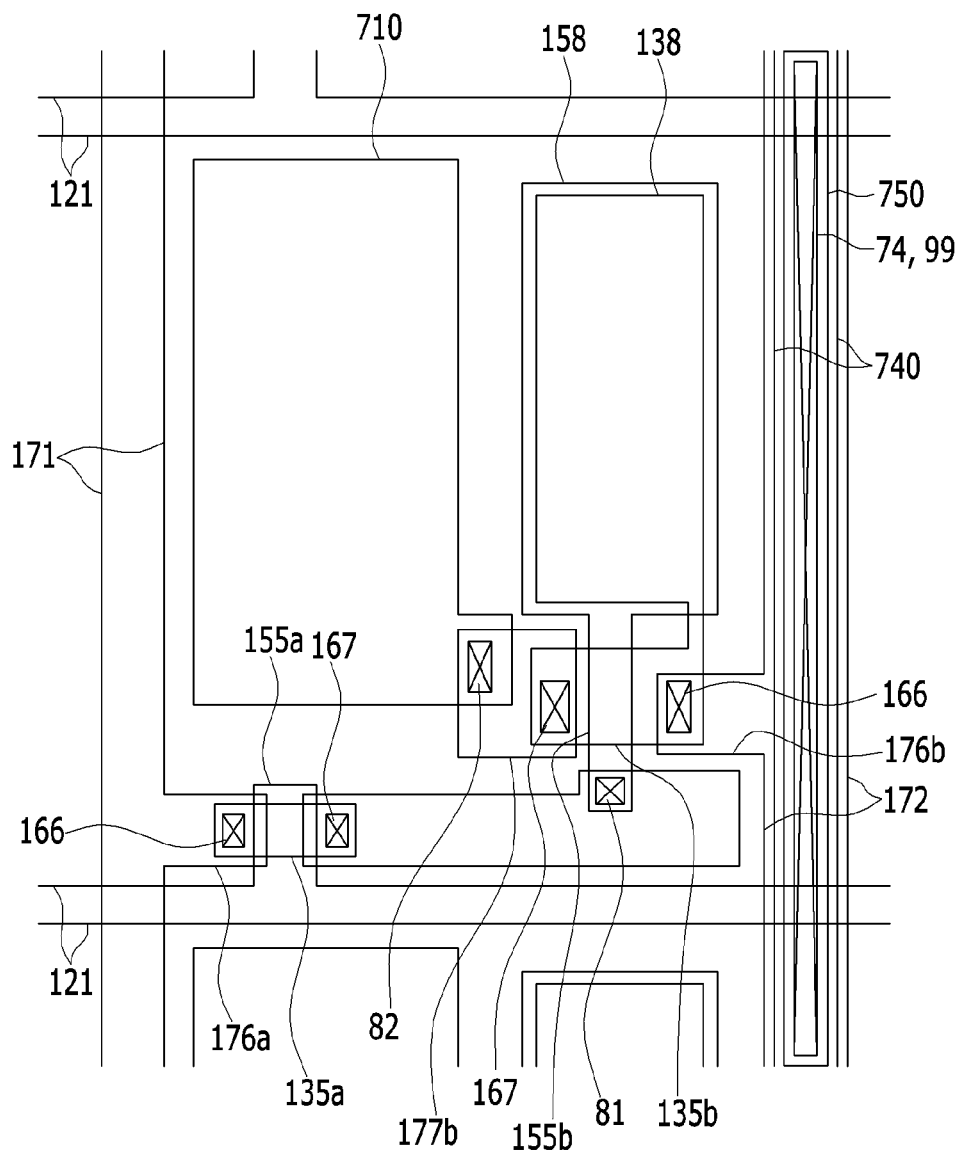
FIG. 4 is a plan view of another exemplary embodiment of one pixel of an OLED display according to the invention.

FIG. 2 is a plan view of one pixel of the OLED display of FIG. 1, FIG. 3 is a cross-sectional view taken along line III-III of FIG. 2, and FIG. 4 is a plan view of one pixel of an OLED display according to another exemplary embodiment.

As shown in FIGS. 2 and 3, a buffer layer 120 is disposed on a substrate 100.

In an exemplary embodiment, the substrate 100 may be an insulating substrate including glass, quartz, ceramic, or a polymer material, or the substrate 100 may be a metallic substrate including a stainless steel. The polymer material may be an organic material selected from at least one of polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyallylate, polyimide, polycarbonate ("PC"), cellulose triacetate ("TAC"), cellulose acetate propionate ("CAP") that are insulating organic materials, or any combinations thereof.

The buffer layer 120 is disposed on the substrate 100.

In an exemplary embodiment, the buffer layer 120 may have a single-layered structure including silicon nitride (SiNx), or a double-layered structure including silicon nitride (SiNx) and silicon oxide (SiO2). The buffer layer effectively prevents unwanted components like impure elements or moisture from intruding into a target, while simultaneously flattening the surface thereof.

A first semiconductor 135a and a second semiconductor 135b including polysilicon and a first capacitor electrode 138 are disposed on the buffer layer 120.

The first semiconductor 135a and the second semiconductor 135b are divided into respective channel regions 1355a and 1355b and source regions 1356a and 1356b and drain regions 1357a and 1357b, respectively, disposed on both sides of the channel regions 1355a and 1355b. The channel regions 1355a and 1355b of the first semiconductor 135a and the second semiconductor 135b include polysilicon into which impurities have not been doped, that is, intrinsic semiconductors. The source regions 1356a and 1356b and the drain regions 1357a and 1357b of the first semiconductor 135a and the second semiconductor 135b include polysilicon into which conductive impurities have been doped, that is, impurity semiconductors.

The impurities doped into the source regions 1356a and 1356b, the drain regions 1357a and 1357b, and the first capacitor electrode 138 may be either p-type impurities or n-type impurities.

A gate insulating layer 140 is disposed on the first semiconductor 135a, the second semiconductor 135b and the first capacitor electrode 138. In an exemplary embodiment, the gate insulating layer 140 may be a single layer or a plurality of layers including at least one of tetraethyl orthosilicate ("TEOS"), silicon nitride (SiNx), silicon oxide (SiO2) or any combinations thereof.

The gate line 121, a second gate electrode 155b, and a second capacitor electrode 158 are disposed on the gate insulating layer 140.

The gate line 121 lengthily extends in a horizontal direction and transfers a gate signal, and includes a first gate electrode 155a that is protruded from the gate line 121 to the first semiconductor 135a.

The first gate electrode 155a and the second gate electrode 155b overlap with the respective channel regions 1355a and 1355b, and the second capacitor electrode 158 overlaps with the first capacitor electrode 138.

Each of the second capacitor electrode 158, the first gate electrode 155a, and the second gate electrode 155b may have a single layer of a plurality of layers including molybdenum, tungsten, copper, aluminum, or an alloy thereof.

The first capacitor electrode 138 and the second capacitor electrode 158 provide a capacitor Cst using the gate insulating layer 140 as a dielectric material.

A first interlayer insulating layer 160 is disposed on the first gate electrode 155a, the second gate electrode 155b and the second capacitor electrode 158. The first interlayer insulating layer 160, like the gate insulating layer 140, may include TEOS, silicon nitride (SiNx) or silicon oxide (SiO2).

A source contact hole 166 and a drain contact hole 167 through which the source regions 1356a and 1356b and the drain regions 1357a and 1357b are exposed, respectively, are defined in the first interlayer insulating layer 160 and the gate insulating layer 140.

The data lines 171 including a first source electrode 176a, the driving voltage lines 172 including a second source electrode 176b, a first drain electrode 177a and a second drain electrode 177b are disposed on the first interlayer insulating layer 160.

The data line 171 transmits a data signal and extends in a direction crossing the gate line 121.

The driving voltage line 172 transmits a predetermined voltage, and extends in the same direction as that of the data line 171 while being separated from the data line 171.

The first source electrode 176a protrudes toward the first semiconductor 135a from the data line 171, and the second source electrode 176b protrudes toward the second semiconductor 135b from the driving voltage line 172. The first source electrode 176a and the second source electrode 176b are connected with the source regions 1356a and 1356b through the source contact holes 166, respectively.

The first drain electrode 177a faces the first source electrode 176a and is connected with the drain region 1357a through the drain contact hole 167.

The first drain electrode 177a extends along the gate line, and is electrically connected with the second gate electrode 155b through a contact hole 81.

The second drain electrode 177b is connected with the drain region 1357b through the drain contact hole 167.

The data line 171, the driving voltage line 172, and the first drain electrode 177a may be provided as a single layer or a multilayer including a low resistance material, such as aluminum (Al), titanium (Ti), molybdenum (Mo), copper (Cu), nickel (Ni), or an alloy thereof, or a corrosion resistant material. In an exemplary embodiment, the data line 171, the driving voltage line 172, and the first drain electrode 177a may be triple layers including Ti/Cu/Ti or Ti/Ag/Ti.

In the exemplary embodiment, the capacitor Cst is provided by overlapping the first capacitor electrode 138 and the second capacitor electrode 158, but the capacitor Cst including a metal/dielectric/metal structure may be provided by disposing an electrode in and/or on the same layer as that of the data line 171 or the same layer as that of a first electrode 710.

A second interlayer insulating layer 180 is disposed on the data line 171, the driving voltage line 172, the first drain electrode 177a and the second drain electrode 177b.

The first electrode 710 and an assistance electrode 740 are disposed on the second interlayer insulating layer 180.

The first electrode 710 may be an anode electrode of the organic light emitting element of FIG. 1. The first electrode 710 is connected with the second drain electrode 177b through a contact hole 82.

In the exemplary embodiment, the second drain electrode 177b and the first electrode 710 are connected through the contact hole 82 with the second interlayer insulating layer 180 interposed therebetween, but the invention is not limited thereto and the second drain electrode 177b and the first electrode 710 may be integrally provided.

The assistance electrode 740 is separated from the first electrode 710 and overlaps at least one of the data line 171 and the driving voltage line 172 thereby extending according thereto. The assistance electrode 740 to effectively reduce the voltage drop of a second electrode 730 may be applied with the same voltage as the second electrode 730.

An organic emission layer 720 is disposed on the entire substrate including the first electrode 710. A contact hole 74 exposing the assistance electrode 740 is defined in the organic emission layer 720.

In an exemplary embodiment of FIG. 2, a plurality of contact holes 74 is defined at predetermined intervals. However, as shown in FIG. 4, they may be lengthily defined along the assistance electrode 740.

The organic emission layer 720 may include a low molecular organic material or a high molecular organic material, such as poly(3,4-ethylenedioxythiophene) ("PEDOT"). Further, the organic emission layer 720 may be provided as a multilayer including a light emission layer and at least one of a hole injection layer ("HIL"), a hole transporting layer ("HTL"), an electron transporting layer ("ETL"), and an electron injection layer ("EIL")". In an exemplary embodiment, the HIL is disposed on the first electrode 710 that is the anode, and the HTL, the emission layer, the ETL and the EIL may be sequentially deposited thereon.

For the organic emission layer 720, a red organic emission layer, a green organic emission layer and a blue organic emission layer may be laminated together on the red pixel, green pixel and blue pixel, and a red color filter, a green color filter and a blue color filter may be provided for the respective pixels, thereby displaying a color image. In another exemplary embodiment, a white organic emission layer for emitting white light may be disposed on all of the red, green and blue pixels, and a red color filter, a green color filter and a blue color filter may be provided for the respective pixels, thereby displaying a color image.

In the organic emission layer 720 according to the invention, since the deposition structure of the red pixel, the blue pixel and the green pixel is the same, there is no need to use a deposition mask for depositing the red, green and blue organic emission layers on the respective pixels, i.e., the red, green and blue pixels.

The white organic emission layer described in the exemplary embodiment may be provided as one organic emission layer or a plurality of organic emission layers that is laminated to emit white light. In an exemplary embodiment, at least one yellow organic emission layer and at least one blue organic emission layer may be combined to emit white light, at least one cyan organic emission layer and at least one red organic emission layer may be combined to emit white light, or at least one magenta organic emission layer and at least one green organic emission layer may be combined to emit white light.

An opening 99 exposing the contact hole 74 may be defined in a second electrode 730 disposed on the organic emission layer 720.

The second electrode 730 becomes the cathode of the organic light emitting element. Accordingly, the first electrode 710, the organic emission layer 720 and the second electrode 730 provide the OLED 70.

A connection electrode 750 contacting an upper surface of the assistance electrode 740 and an etch surface of the opening 99 is disposed in the contact hole 74. The opening 99, the contact hole 74 and the connection electrode 750 may have a plane shape of the same size. This is because the connection electrode 750 is provided by a lift-off process, and will be described in detail in the manufacturing method of the OLED display.

The OLED display may have any one structure among a top emission type, a bottom emission type, and a dual (both-side) emission type according to a direction of emitting light by the OLED 70.

In the top display type of OLED display according to the exemplary embodiment, the first electrode 710 is provided as a reflective layer, and the second electrode 730 is provided as a transparent layer or a semi-transparent layer.

The reflective layer and the semi-transparent layer include at least one metal among magnesium (Mg), silver (Ag), gold (Au), calcium (Ca), lithium (Li), chromium (Cr), and aluminum (Al), or an alloy thereof. The reflective layer and the semi-transparent layer are determined by thickness, and the semi-transparent layer may be provided to have a thickness equal to or less than about 200 nanometers (nm). As the thickness is decreased, transmittance of light is increased, but when the thickness is excessively small, resistance is increased. The transparent layer may include a material such as indium tin oxide ("ITO"), indium zinc oxide ("IZO"), zinc oxide ("ZnO"), or indium oxide ($In_2O_3$).

As described in an exemplary embodiment, if the assistance electrode 740 connected to the second electrode 730 is provided, the voltage drop of the driving voltage passing through the second electrode 730 disposed on the entire substrate 100 may be minimized.

The method of manufacturing the OLED display will now be described in detail with reference to FIGS. 4 to 15 as well as FIGS. 2 and 3.

Figure 5:
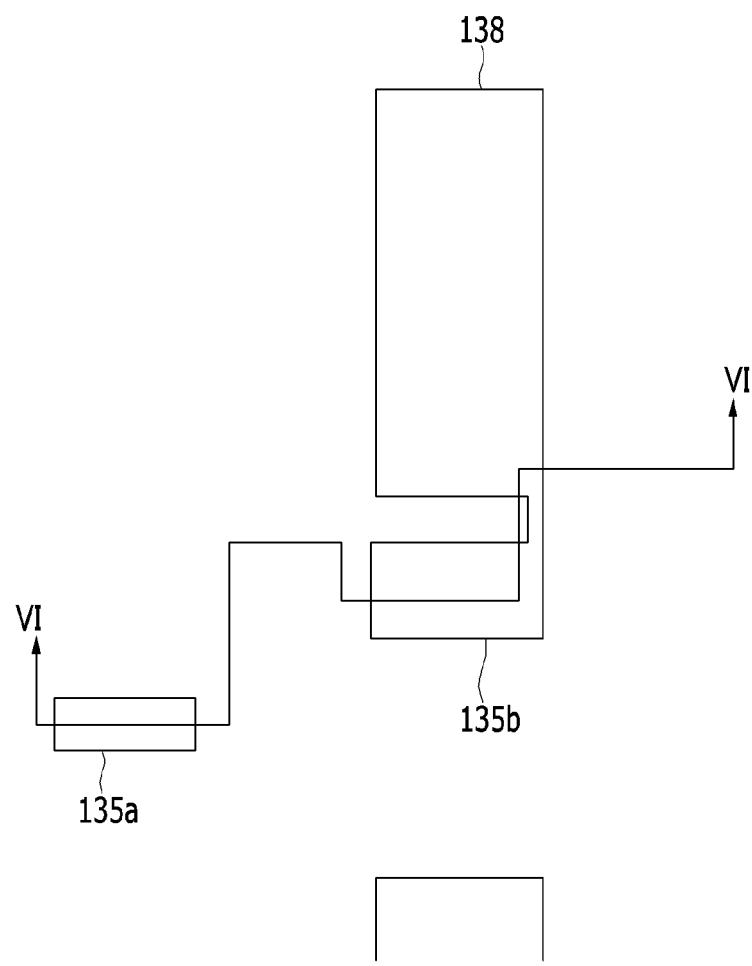
FIGS. 5, 7, 9, 11 and 13 are plan views sequentially showing a process of an exemplary embodiment of a manufacturing method of an OLED display according to the invention.
Figure 6:
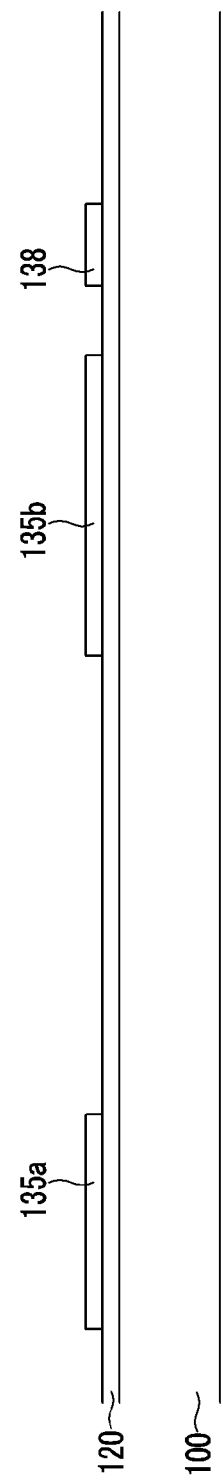
FIG. 6 is a cross-sectional view taken along line VI-VI of FIG. 5.
Figure 7:
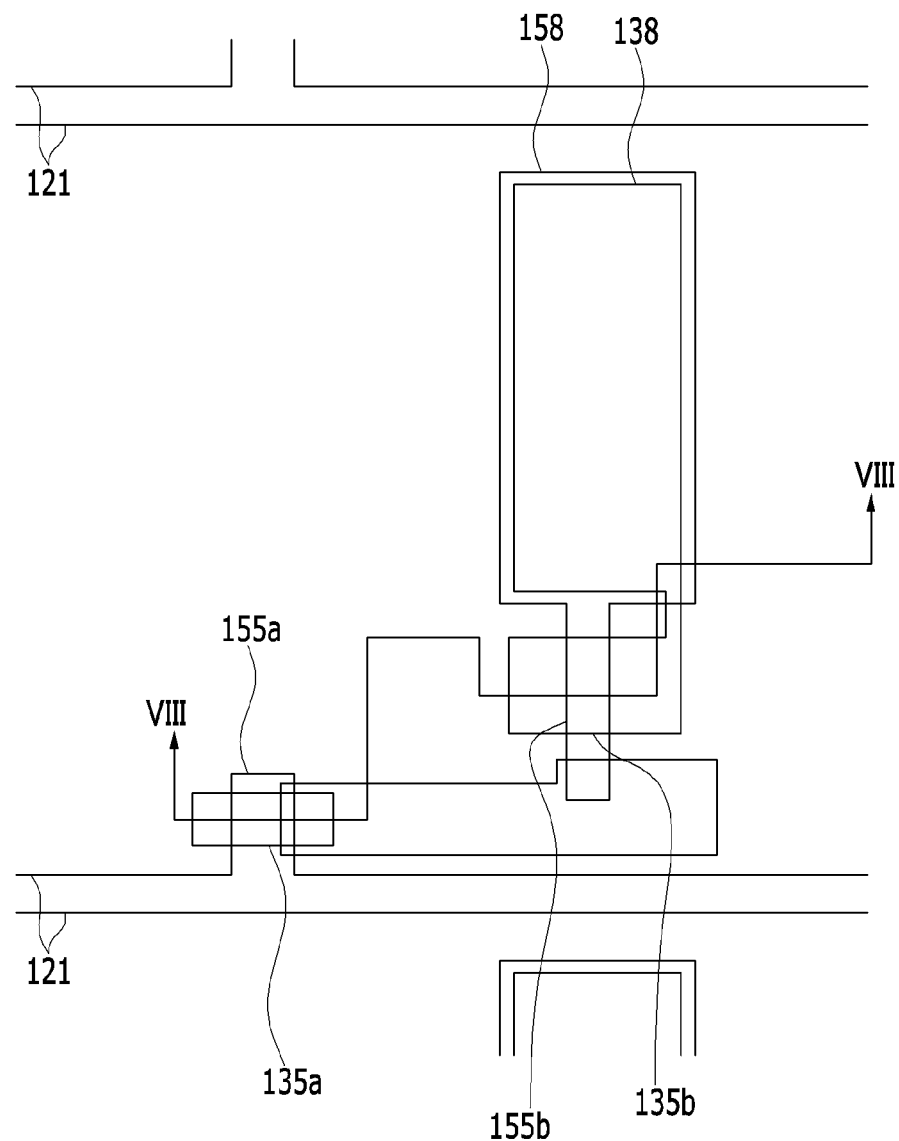
Figure 8:
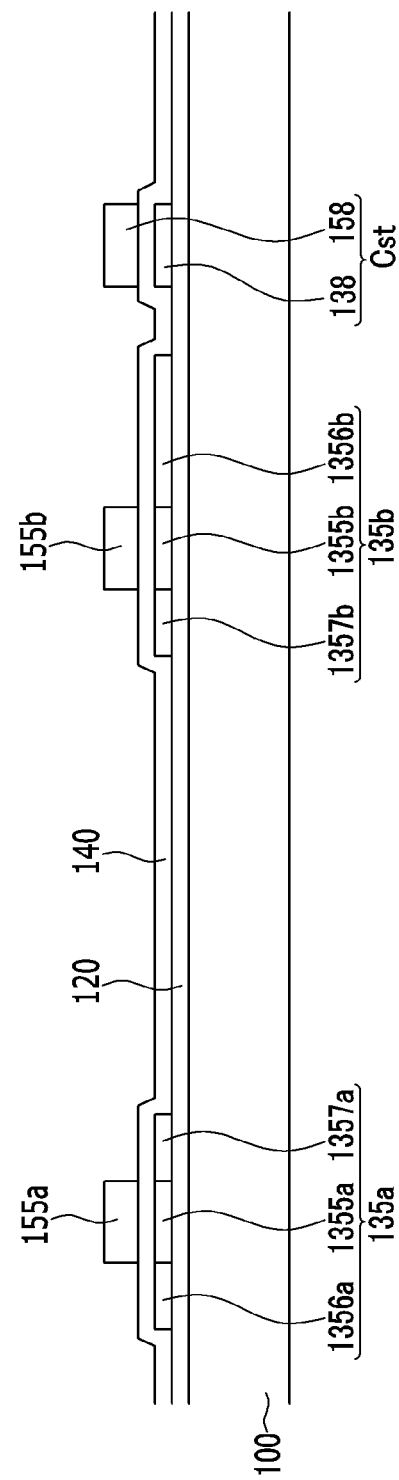
FIG. 8 is a cross-sectional view taken along line VIII-VIII of FIG. 7.
Figure 9:
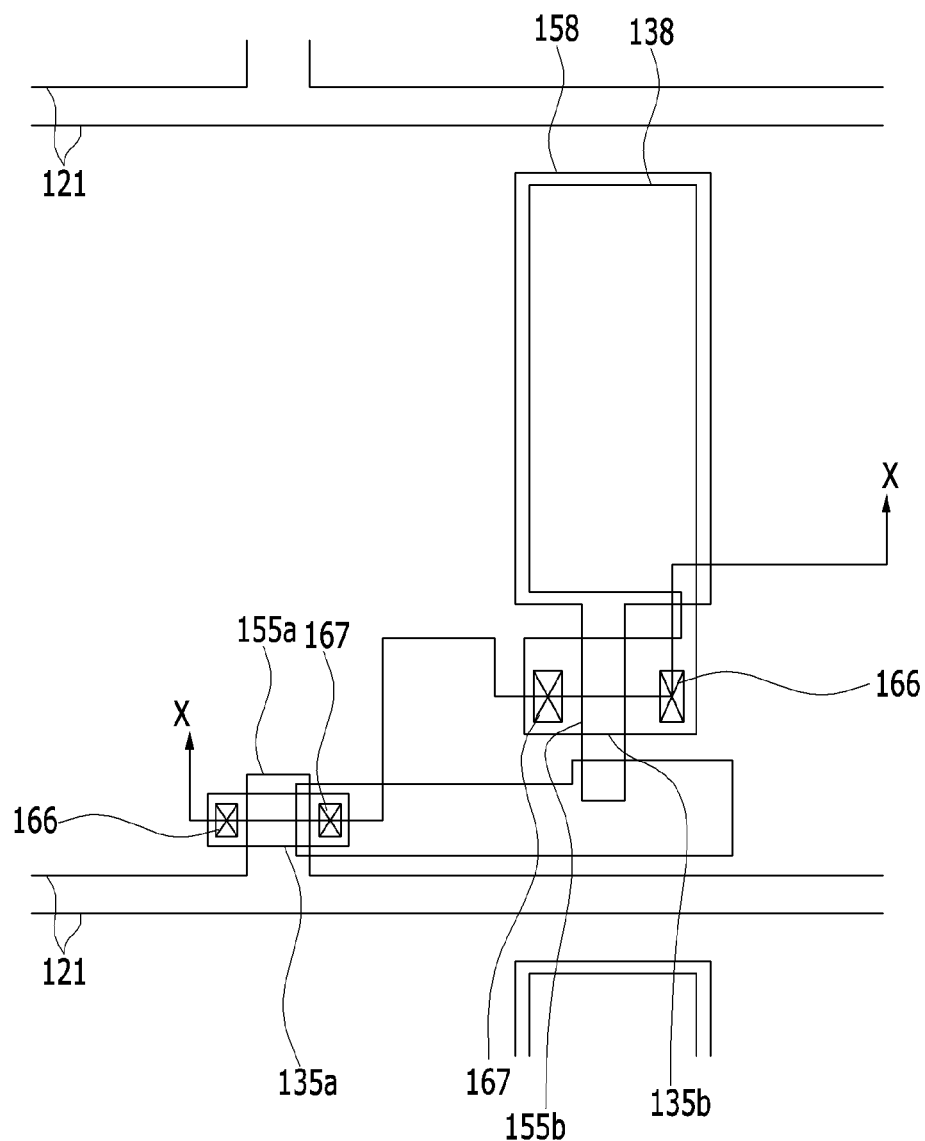
Figure 10:
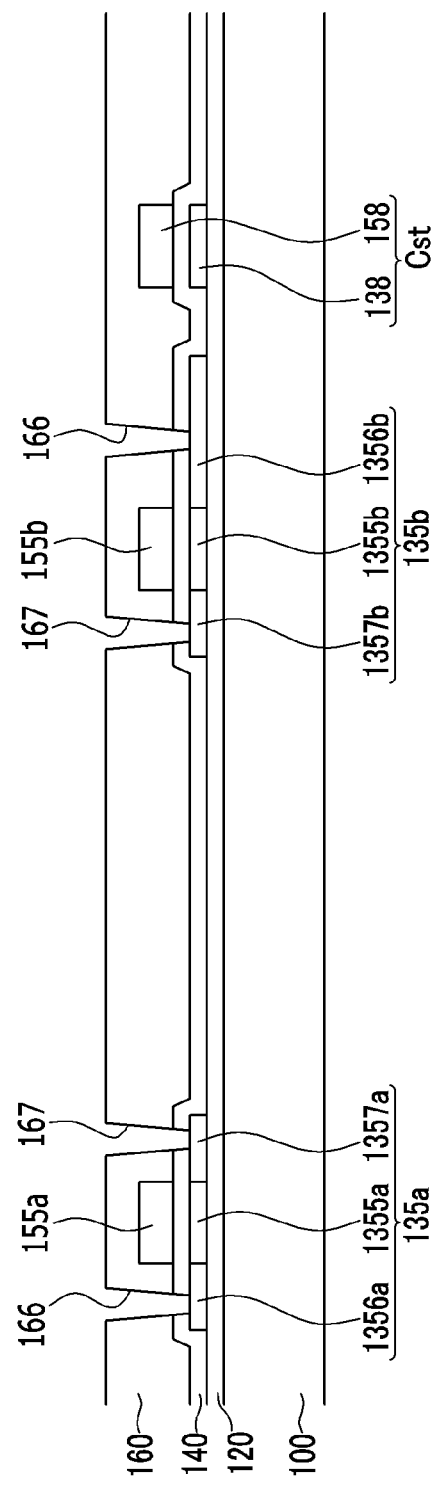
FIG. 10 is a cross-sectional view taken along line X-X of FIG. 9.
Figure 11:
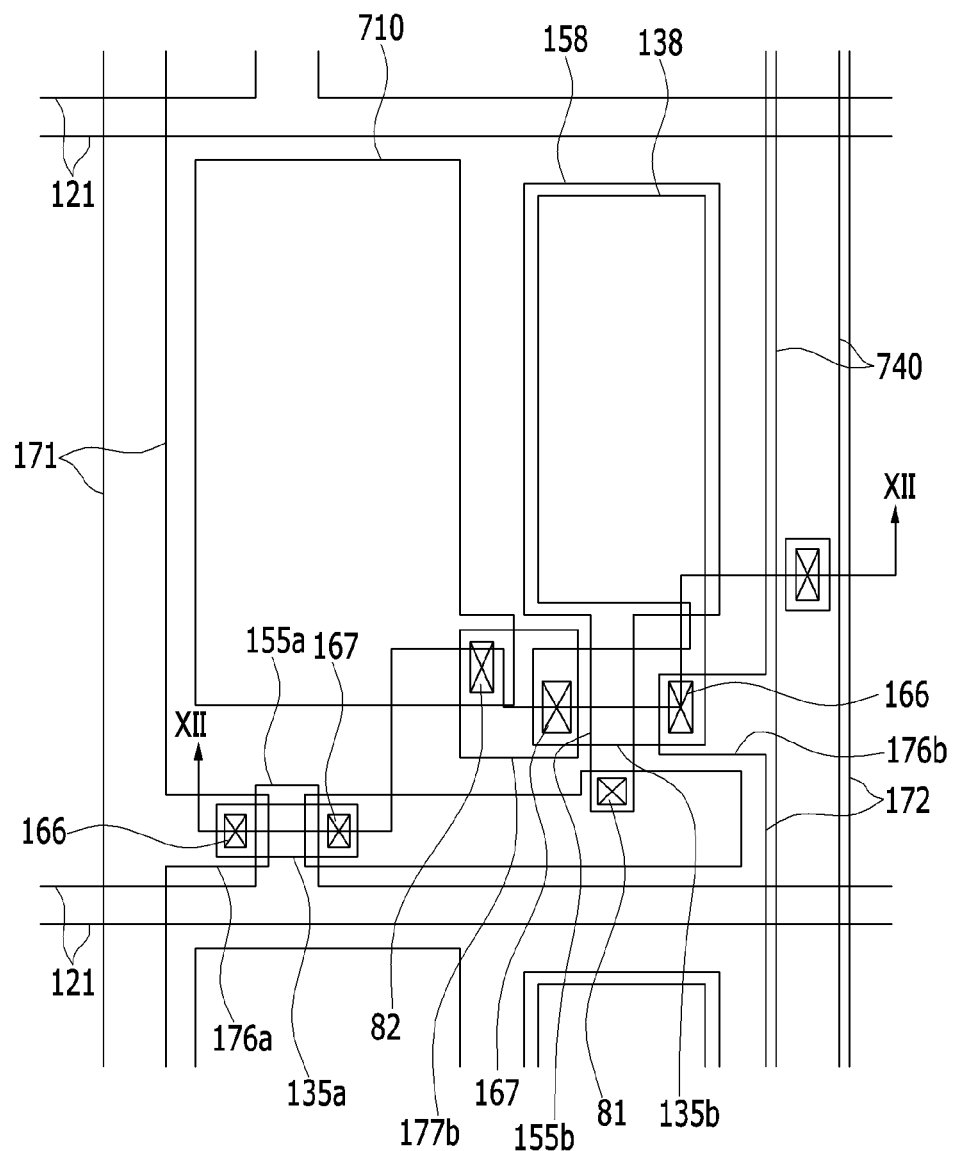
Figure 12:
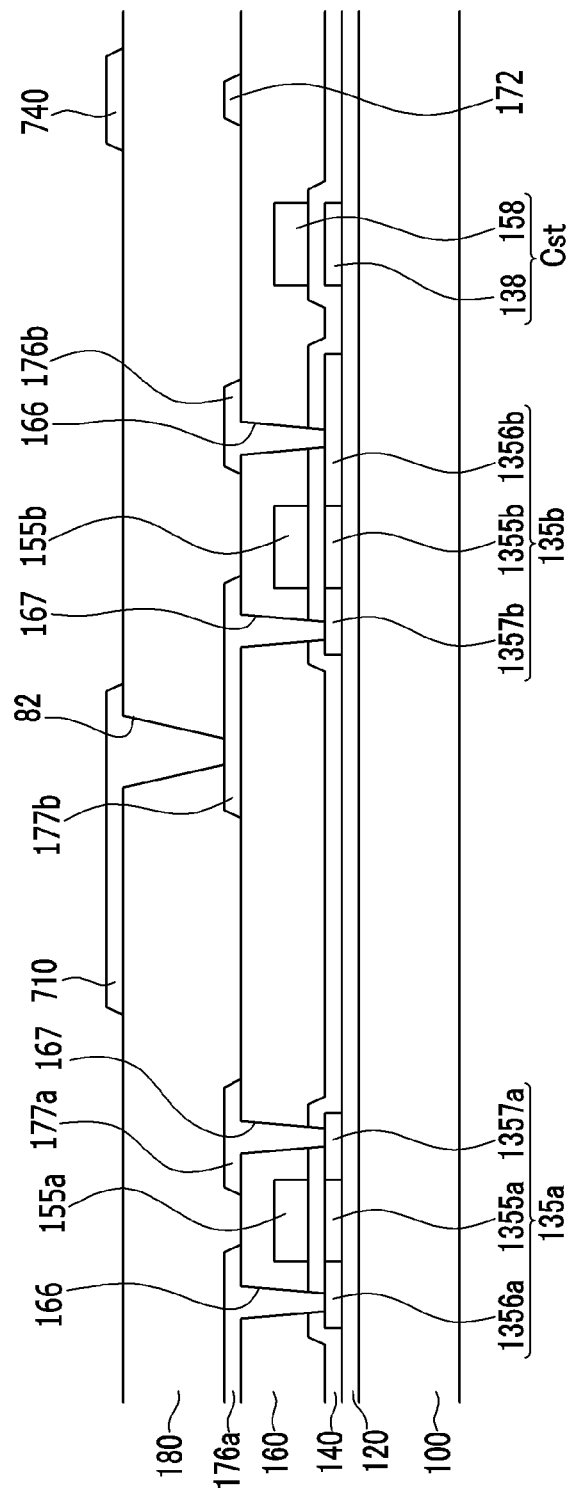
FIG. 12 is a cross-sectional view taken along line XII-XII of FIG. 11.
Figure 13:
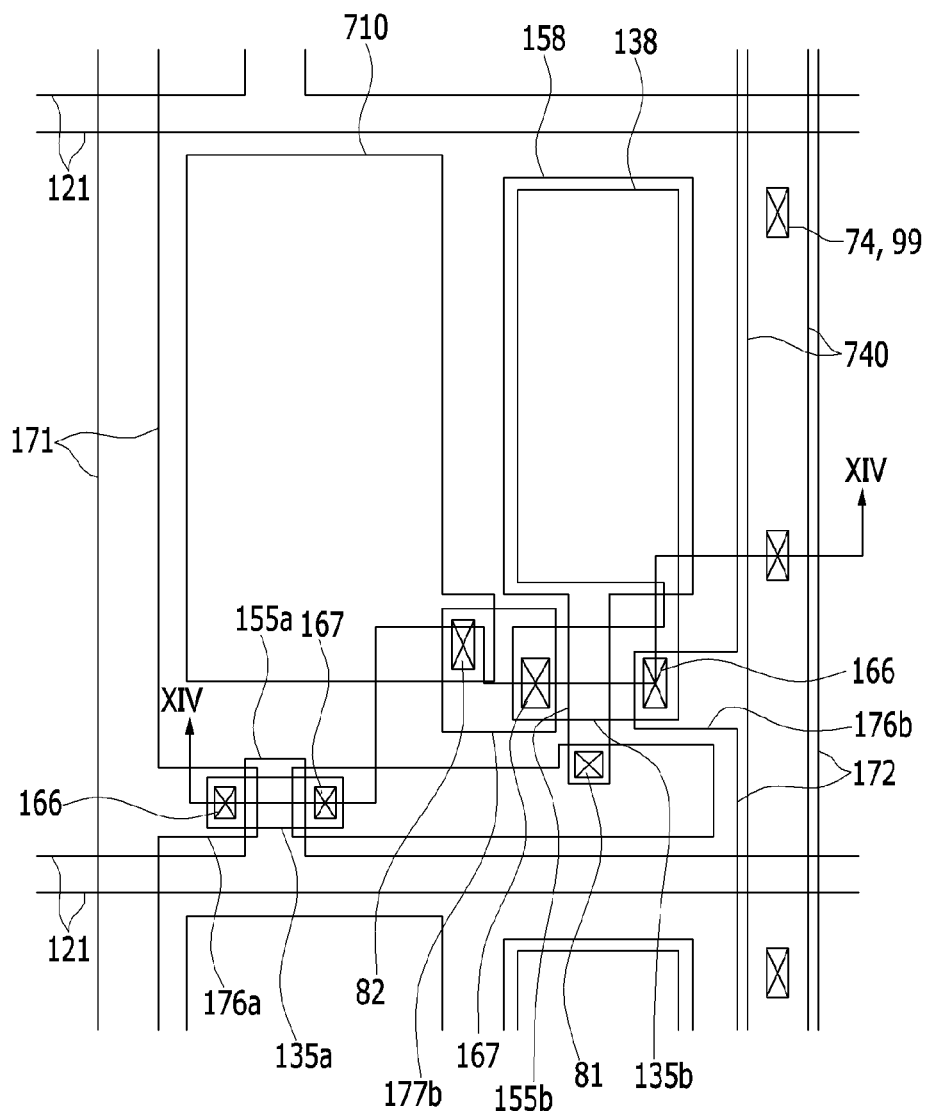
Figure 14:
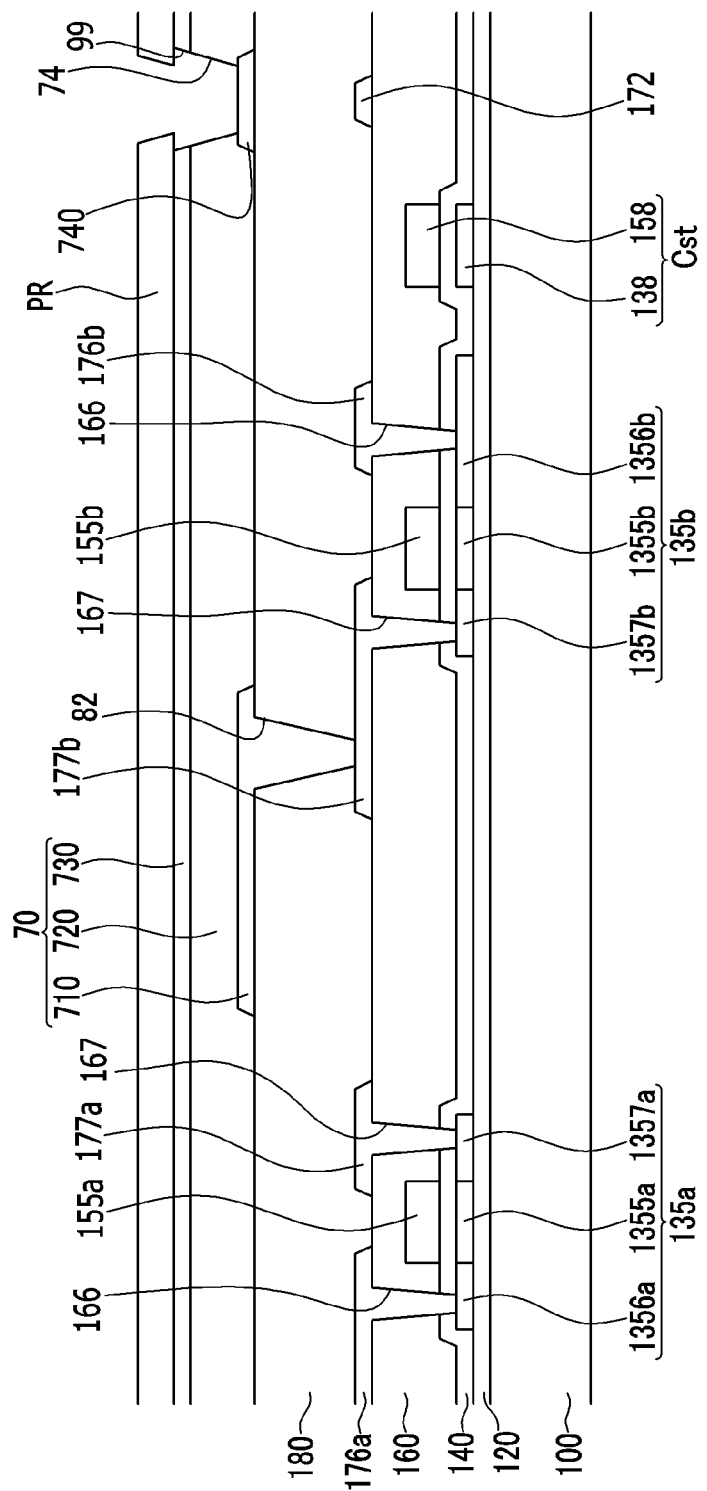
FIG. 14 is a cross-sectional view taken along line XIV-XIV of FIG. 13.
Figure 15:
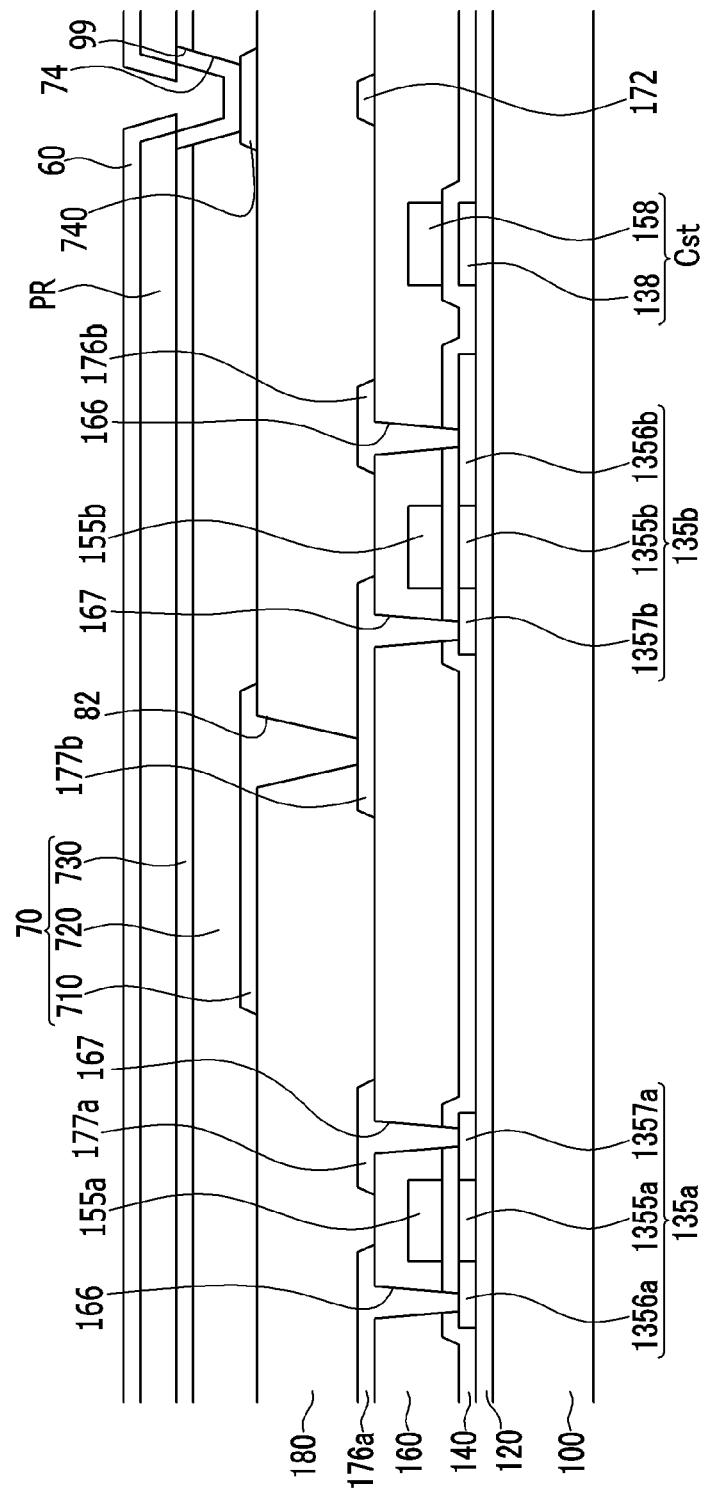
FIG. 15 is a cross-sectional view taken along line XIV-XIV of FIG. 13 in a step following FIG. 14.

FIGS. 5, 7, 9, 11 and 13 are plan views sequentially showing a process of a manufacturing method of an OLED display according to an exemplary embodiment, FIG. 6 is a cross-sectional view taken along line VI-VI of FIG. 5, FIG. 8 is a cross-sectional view taken along line VIII-VIII of FIG. 7, FIG. 10 is a cross-sectional view taken along line X-X of FIG. 9, FIG. 12 is a cross-sectional view taken along line XII-XII of FIG. 11, FIG. 14 is a cross-sectional view taken along line XIV-XIV of FIG. 13, and FIG. 15 is a cross-sectional view taken along line XIV-XIV of FIG. 13 in a step following FIG. 14.

Firstly, as shown in FIGS. 5 and 6, the buffer layer 120 is disposed on the substrate 100. The buffer layer 120 includes silicon nitride or silicon oxide.

After providing a polysilicon film on the buffer layer 120, the first semiconductor 135a, the second semiconductor 135b, and the first capacitor electrode 138 are provided by patterning the polysilicon film.

Next, as shown in FIGS. 7 and 8, the gate insulating layer 140 is disposed on the first semiconductor 135a and the second semiconductor 135b. The gate insulating layer 140 may include silicon nitride (SiNx) or silicon oxide (SiO2).

Furthermore, after stacking a metal film on the gate insulating layer 140, the first and second gate electrodes 155a and 155b and the second capacitor electrode 158 are provided by patterning the metal film.

The source regions 1356a and 1356b, the drain regions 1357a and 1357b and the channel regions 1355a and 1355b are provided by doping conductive impurities into the first semiconductor 135a and the second semiconductor 135b by using the first gate electrode 155a and the second gate electrode 155b as a mask. In some exemplary embodiments, prior to the formation of the first gate electrode 155a and the second gate electrode 155b, the conductive impurities may also be doped into the first capacitor electrode 138 using a photoresist film. Furthermore, when each of the first gate electrode 155a and the second gate electrode 155b includes a dual layer and the second capacitor electrode 158 includes a single layer, the conductive impurities may also be doped into the first capacitor electrode 138 along with the source regions 1356a and 1356b and the drain regions 1357a and 1357b.

As shown in FIGS. 9 and 10, the contact holes 166 and 167 through which the source region and the drain region are respectively exposed are defined in the interlayer insulating layer 160 disposed on the first and second gate electrodes 155a and 155b and the second capacitor electrode 158. The interlayer insulating layer 160 may include TEOS, silicon nitride (SiNx), or silicon oxide (SiO2). Furthermore, the interlayer insulating layer 160 may include a low dielectric constant material in order to provide a flan substrate thereof.

Next, as shown in FIGS. 11 and 12, the data lines 171 including the first source electrode 176a, the driving voltage lines 172 including the second source electrode 176b, a first drain electrode 177a and a second drain electrode 177b are disposed on the first interlayer insulating layer 160.

Then, the second interlayer insulating layer 180 is disposed on the data lines 171 including a first source electrode 176a, the driving voltage lines 172 including a second source electrode 176b, a first drain electrode 177a and a second drain electrode 177b. The contact hole 82 exposing the second drain electrode 177b is defined in the second interlayer insulating layer 180.

ITO/Ag/ITO is deposited and patterned on the second interlayer insulating layer 180 to provide the first electrode 710 and the assistance electrode 740.

Next, as shown in FIGS. 13 and 14, the organic emission layer 720 and a first metal layer are disposed on the first electrode 710 and the assistance electrode 740.

The organic emission layer 720 is disposed on the entire substrate without an additional mask, and the hole auxiliary layer, the red organic emission layer, the green organic emission layer, the blue organic emission layer and the electron auxiliary layer may be sequentially deposited.

The first metal layer as the semi-transparent layer may be provided by depositing an Mg—Ag alloy. The first metal layer forming the second electrode 730 is provided with the thickness of about 500 nm.

Next, a photoresist pattern PR is disposed on the first metal layer.

The photoresist pattern PR maintained at the region corresponding to the first electrode 710 and is removed at a portion of the region corresponding to the assistance electrode 740 to expose the first metal layer.

The first metal layer and the organic emission layer 720 are etched by using the photoresist pattern PR as a mask to provide the opening 99 exposing the underlying assistance electrode 740 and the contact hole 74 defined in the second electrode 730.

At this time, the second electrode 730 and the organic emission layer 720 are over-etched to provide an under-cut under the photoresist pattern PR.

Next, as shown in FIG. 15, the second metal layer 60 is disposed on the entire substrate of the photoresist pattern PR, including in the opening 99 and the contact hole 74. At this time, portions of the second metal layer 60 are disconnected by the under-cut of the photoresist pattern PR.

Next, as shown in FIGS. 2 and 3, the photoresist pattern PR is removed by a lift-off process to provide the connection electrode 750. At this time, since the second metal layer 60 is disconnected by the under-cut of the photoresist pattern PR, when removing the photoresist pattern, the overlying second metal layer 60 is removed along with the photoresist pattern, however the second metal layer 60 positioned in the contact hole contacts the etching surface of the opening 99, thereby providing the connection electrode 750 electrically connecting the second electrode 730 and the assistance electrode 740.

The connection electrode 750 may include a material having an excellent contact characteristic with the second electrode 730 and the assistance electrode 740 while having low resistance, for example, copper, titanium, aluminum, ITO, Mo etc.

In an exemplary embodiment, by providing the assistance electrode, the voltage drop of the second electrode may be minimized. Also, by connecting the assistance electrode and the second electrode by using the connection electrode through the lift-off process, since a process to provide the assistance electrode on the second electrode by using a fine metal mask ("FMM"), the assistance electrode having the uniform electrical characteristics may be provided.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting diode display comprising:
a substrate;
a first electrode and an assistance electrode disposed on the substrate and separated from each other;
an organic emission layer disposed on the first electrode;
a contact hole which exposes the assistance electrode and is defined in the organic emission layer;
a second electrode disposed on the organic emission layer and electrically connected to the assistance electrode through the contact hole, and
a connection electrode which connects the assistance electrode and the second electrode, and is disposed in the contact hole and non-overlapping with an upper surface of the second electrode.

2. The organic light emitting diode display of claim 1, wherein
the connection electrode contacts an etching surface of an opening which is defined in the second electrode and an upper surface of the assistance electrode.

3. The organic light emitting diode display of claim 2, wherein
the opening, the contact hole, and the connection electrode have a plane shape of a same size.

4. The organic light emitting diode display of claim 1, wherein
the assistance electrode and the second electrode are applied with a same voltage.

5. The organic light emitting diode display of claim 1, further comprising:
a gate line disposed on the substrate;
a data line and a driving voltage line insulated from and intersecting the gate line, and separated from each other;
a switching thin film transistor connected to the gate line and the data line; and
a driving thin film transistor connected to the switching thin film transistor and the driving voltage line,
wherein the first electrode is connected to a drain electrode of the driving thin film transistor.

6. The organic light emitting diode display of claim 5, wherein
the contact hole overlaps at least one of the data line and the driving voltage line, and a plurality of contact holes is defined at predetermined intervals according to the data line and the driving voltage line.

7. The organic light emitting diode display of claim 5, wherein
the contact hole overlaps at least one of the data line and the driving voltage line, and is lengthily defined according to the data line and the driving voltage line.

8. The organic light emitting diode display of claim 1, wherein
the organic emission layer is disposed on an entire surface of the substrate.

9. The organic light emitting diode display of claim 8, wherein
the first electrode includes a reflective layer, and
the second electrode includes a transparent layer or a semi-transparent layer.

10. A method of manufacturing an organic light emitting diode display, comprising:
forming a thin film transistor on a substrate;
forming a first electrode connected to the thin film transistor and an assistance electrode separated from the first electrode;
forming an organic emission layer on the first electrode and the assistance electrode;
forming a first metal layer on the organic emission layer;
forming a photoresist pattern on the first metal layer;
etching the first metal layer and the organic emission layer by using the photoresist pattern as a mask to define an opening exposing the assistance electrode and a contact hole in a second electrode;
forming a second metal layer on the photoresist pattern; and
removing the photoresist pattern to form a connection electrode disposed in the contact hole and contacting an upper surface of the assistance electrode and an etching surface of the opening.

11. The method of claim 10, wherein,
in the defining the contact hole in the second electrode, an under-cut is provided under the photoresist pattern.

12. The method of claim 10, wherein
the organic emission layer is disposed on an entire surface of the substrate.

13. The method of claim 12, wherein
the first metal layer includes a transparent layer or a semi-transparent layer.

14. The method of claim 13, wherein
the first electrode includes a reflective layer.

* * * * *